(12) United States Patent
Nomura (10) Patent No.: US 11,903,120 B2
(45) Date of Patent: Feb. 13, 2024

(54) RADIO FREQUENCY MODULE

(71) Applicant: Murata Manufacturing Co., Ltd., Kyoto (JP)

(72) Inventor: Tadashi Nomura, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 820 days.

(21) Appl. No.: 16/990,109

(22) Filed: Aug. 11, 2020

(65) Prior Publication Data
US 2020/0375022 A1    Nov. 26, 2020

Related U.S. Application Data

(63) Continuation of application No. PCT/JP2019/004925, filed on Feb. 13, 2019.

(30) Foreign Application Priority Data

Feb. 15, 2018    (JP) ................... 2018-024758

(51) Int. Cl.
*H05K 1/02*    (2006.01)
*H05K 3/28*    (2006.01)
(Continued)

(52) U.S. Cl.
CPC ........... *H05K 1/0218* (2013.01); *H01L 23/00* (2013.01); *H01L 23/28* (2013.01); *H01L 25/04* (2013.01);
(Continued)

(58) Field of Classification Search
CPC .... H05K 1/0218; H05K 1/0243; H05K 3/284; H05K 2201/0715; H05K 2201/09936;
(Continued)

(56) References Cited

U.S. PATENT DOCUMENTS

| | | | |
|---|---|---|---|
| 2009/0289340 A1* | 11/2009 | Yamazaki | ........ G06K 19/07749 257/679 |
| 2010/0072583 A1* | 3/2010 | Oikawa | ................... H01L 23/66 257/E23.116 |
| 2012/0015687 A1 | 1/2012 | Yamada et al. | |

(Continued)

FOREIGN PATENT DOCUMENTS

| | | |
|---|---|---|
| CN | 107535078 A | 1/2018 |
| JP | 2010129847 A | 6/2010 |

(Continued)

OTHER PUBLICATIONS

International Search Report issued in Application No. PCT/JP2019/004925, dated Apr. 16, 2019.

(Continued)

*Primary Examiner* — Arnold M Kinkead
(74) *Attorney, Agent, or Firm* — Pearne & Gordon LLP (57) ABSTRACT

An adhesion between a sealing resin layer and a shield film is improved by a mesh sheet disposed on an opposite surface of the sealing resin layer. A radio frequency module includes a wiring board, a component mounted on an upper surface of the wiring board, a sealing resin layer that covers the component, a mesh sheet disposed on an upper surface of the sealing resin layer, and a shield film provided to cover the upper surface and side surfaces of the sealing resin layer, and the mesh sheet. The mesh sheet and the sealing resin layer, as well as the mesh sheet and the shield film are firmly in adhesion with one another. Thus, the adhesion between the sealing resin layer and the shield film can be improved.

10 Claims, 5 Drawing Sheets

(51) Int. Cl.
*H01L 23/28* (2006.01)
*H01L 25/04* (2023.01)
*H01L 25/18* (2023.01)
*H01L 23/00* (2006.01)

(52) U.S. Cl.
CPC ........... *H01L 25/18* (2013.01); *H05K 1/0243* (2013.01); *H05K 3/284* (2013.01); *H05K 2201/0715* (2013.01); *H05K 2201/09936* (2013.01); *H05K 2201/10522* (2013.01); *H05K 2203/107* (2013.01)

(58) Field of Classification Search
CPC ... H05K 2201/10522; H05K 2203/107; H05K 2201/0723; H05K 2201/0919; H05K 1/0269; H05K 2201/029; H05K 2201/09681; H05K 2201/10371; H05K 2201/10734; H05K 2203/1327; H05K 3/386; H05K 9/00; H01L 23/00; H01L 23/28; H01L 25/04; H01L 25/18
USPC ...... 257/23.116, 679, 23.191, 347, 659, 723, 257/482, 72, 59; 438/114, 106, 128, 652
See application file for complete search history.

(56) References Cited

U.S. PATENT DOCUMENTS

| | | |
|---|---|---|
| 2016/0133579 A1 | 5/2016 | Akiba et al. |
| 2017/0301628 A1 | 10/2017 | Kawabata et al. |
| 2018/0077802 A1 | 3/2018 | Kidoguchi |
| 2018/0077829 A1 | 3/2018 | Yamamoto |

FOREIGN PATENT DOCUMENTS

| | | |
|---|---|---|
| JP | 2010225752 A | 10/2010 |
| JP | 2012039104 A | 2/2012 |
| JP | 2016092275 A | 5/2016 |
| JP | 2017034086 A | 2/2017 |
| JP | 2017143210 A | 8/2017 |
| JP | 2017174949 A | 9/2017 |
| JP | 2017199871 A | 11/2017 |
| WO | 2012165111 A1 | 12/2012 |
| WO | 2016181706 A1 | 11/2016 |

OTHER PUBLICATIONS

Written Opinion issued in Application No. PCT/JP2019/004925, dated Apr. 16, 2019.

* cited by examiner

RADIO FREQUENCY MODULE

This is a continuation of International Application No. PCT/JP2019/004925 filed on Feb. 13, 2019 which claims priority from Japanese Patent Application No. 2018-024758 filed on Feb. 15, 2018. The contents of these applications are incorporated herein by reference in their entireties.

BACKGROUND

Technical Field

The present disclosure relates to a radio frequency module including a shield.

A motherboard of an electronic device such as a communication terminal device has mounted thereon various radio frequency modules. Such radio frequency modules include a radio frequency module having a structure in which a component mounted on a wiring board is sealed with a sealing resin layer, and a surface of the sealing resin layer is covered with a shield film to shield the component from noise. With the structure in which the surface of the sealing resin layer is covered with the shield film, to obtain sufficient shield effect, the shield film is connected to a ground electrode formed on the wiring board to release noise to the outside via the ground electrode. Moreover, to improve an adhesion between the shield film and the sealing resin layer, there is also suggested a structure in which a metal compound layer is formed between the sealing resin layer and the shield film.

Figure 13:
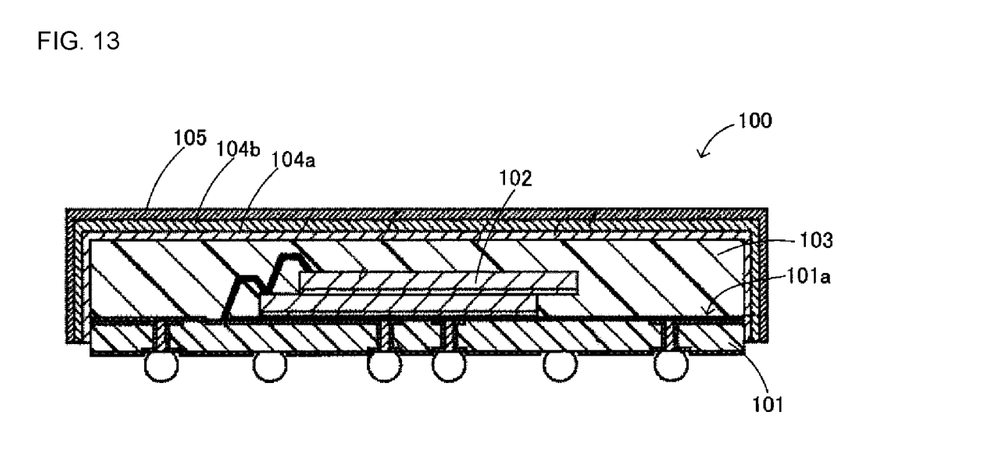
FIG. 13 is a cross-sectional view of a radio frequency module according to related art.

For example, as illustrated in FIG. 13, a radio frequency module 100 of related art includes a semiconductor chip 102 mounted on an upper surface 101a of a wiring board 101, a sealing resin layer 103, a metal compound layer 104a containing a metal carbide, a metal compound layer 104b containing a metal nitride, and a conductive shield layer 105. Both the metal compound layers 104a and 104b are provided on a surface of the sealing resin layer 103. An inorganic filler such as $SiO_2$ included in the sealing resin layer 103 is bonded to metal atoms or nitrogen atoms of the metal nitride included in the metal compound layer 104a. Hence, the adhesion between the sealing resin layer 103 and the conductive shield layer 105 can be improved.

Patent Document 1: Japanese Unexamined Patent Application Publication No. 2017-34086 (see paragraphs 00015 to 0018, FIG 1, etc.)

BRIEF SUMMARY

To attain both the strength of hardened resin and the fluidity of molten resin, the inorganic filler included in the sealing resin layer 103 contains particles with various particle sizes in a range from 10 nm to 50 μm in a mixed manner. When there are differences in size of particles in this way, the inorganic filler is likely shedding from the resin material of the sealing resin layer 103. If there is much inorganic filler shedded from the resin material, the adhesion between the sealing resin layer 103 and the conductive shield 105 is degraded although the metal compound layers 104a and 104b are formed on the surface of the sealing resin layer 103.

The present disclosure provides a radio frequency module in which an adhesion between a sealing resin layer and a shield film is improved.

A radio frequency module according to the present disclosure includes a wiring board; a component mounted on one principal surface of the wiring board; a sealing resin layer that has a contact surface being in contact with the one principal surface of the wiring board, an opposite surface opposite to the contact surface, and side surfaces coupling end edges of the contact surface with end edges of the opposite surface, and that seals the component; a mesh sheet disposed on the opposite surface of the sealing resin layer and formed of a plurality of linear members intersecting with one another in a mesh form; and a shield film that covers at least the side surfaces of the sealing resin layer and the mesh sheet disposed on the opposite surface of the sealing resin layer. A portion of the mesh sheet is embedded in the sealing resin layer in a thickness direction of the mesh sheet.

With this configuration, a bonding portion between the sealing resin layer and the mesh sheet, as well as a bonding portion between the shield film and the mesh sheet are stably secured. Thus, an adhesion between the sealing resin layer and the shield film can be improved.

The mesh sheet may allow an identification symbol or an identification character to be formed therein with a recess formed by laser processing, the mesh sheet may have a plurality of openings formed by the plurality of linear members arranged at a predetermined interval, and the predetermined interval may be smaller than or equal to a spot diameter of a laser beam that is used for the laser processing.

With this configuration, for example, even when the material of the mesh sheet reflects or transmits a laser beam, an organic resin material of the sealing resin layer exposed via the openings is irradiated with a laser beam to be burned. Thus, an identification symbol or an identification character can be formed with a recess formed by laser processing.

Alternatively, the mesh sheet may allow an identification symbol or an identification character to be formed therein with a recess formed by laser processing, the mesh sheet may include a first mesh sheet being in contact with the opposite surface of the sealing resin layer and a second mesh sheet stacked on the first mesh sheet, the plurality of linear members that form the first mesh sheet may be formed of a material that reflects a laser beam, and the plurality of linear members that form the second mesh sheet may be formed of a material that transmits a laser beam.

With this configuration, an identification symbol or an identification character can be formed by laser processing without necessarily a decrease in recognizability of the identification symbol or the identification character.

Alternatively, the mesh sheet may allow an identification symbol or an identification character to be formed therein with a recess formed by laser processing, the mesh sheet may include a first mesh sheet being in contact with the opposite surface of the sealing resin layer and a second mesh sheet stacked on the first mesh sheet, the plurality of linear members that form the first mesh sheet and the plurality of linear members that form the second mesh sheet may be formed of a material that reflects a laser beam, and the second mesh sheet may have a plurality of openings by the plurality of linear members that form the second mesh sheet being arranged at a predetermined interval, and a line width of each of the plurality of linear members that form the second mesh sheet is smaller than a line width of each of the plurality of linear members that form the first mesh sheet.

With this configuration, an identification symbol or an identification character can be formed by laser processing without necessarily a decrease in recognizability of the identification symbol or the identification character. Moreover, the electronic component mounted on the wiring board can be prevented from being damaged with the laser beam that forms the identification symbol or the identification character.

Alternatively, the mesh sheet may allow an identification symbol or an identification character to be formed therein with a recess formed by laser processing, the mesh sheet may include a first mesh sheet being in contact with the opposite surface of the sealing resin layer and a second mesh sheet stacked on the first mesh sheet, and the plurality of linear members that form the first mesh sheet may be formed of a material that absorbs a laser beam.

With this configuration, an identification symbol or an identification character can be formed by laser processing without necessarily a decrease in recognizability of the identification symbol or the identification character. Moreover, the electronic component mounted on the wiring board can be prevented from being damaged with the laser beam that forms the identification symbol or the identification character.

The radio frequency module may further include another component mounted on another principal surface of the wiring board; and an outer connection terminal provided on the other principal surface of the wiring board.

With this configuration, a dual-sided, surface-mount radio frequency module in which an adhesion between a sealing resin layer and a shield film is improved can be provided.

With the present disclosure, by disposing the mesh sheet on the opposite surface of the sealing resin layer, the mesh sheet and the sealing resin layer, as well as the mesh sheet and the shield film are firmly in contact with one another. Thus, the radio frequency module in which the adhesion between the shield film and the sealing resin layer is improved can be provided. In addition, since the mesh sheet has the openings, even when the material of the mesh sheet transmits or absorbs a laser beam, an identification symbol or an identification character which is highly recognizable can be formed by laser processing.

DETAILED DESCRIPTION

First Embodiment

Figure 1:
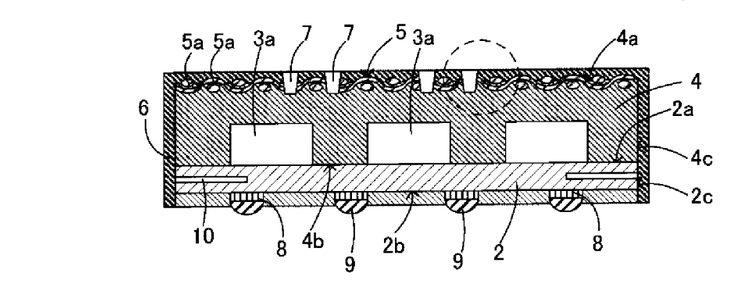
FIG. 1 is a cross-sectional view of a radio frequency module according to a first embodiment of the present disclosure.
Figure 2:
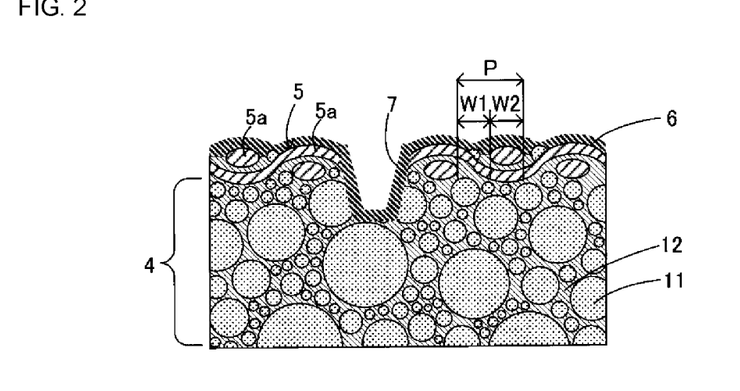
FIG. 2 is an enlarged view of an area surrounded by broken lines of the radio frequency module in FIG. 1.
Figure 3:
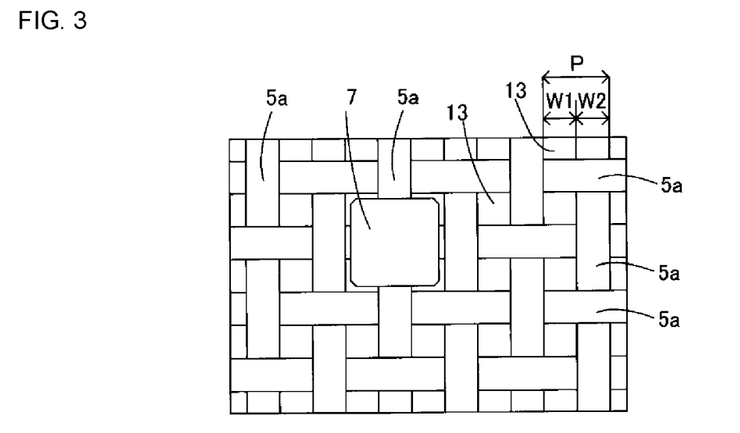
FIG. 3 is a view illustrating a structure of a mesh sheet of the area surrounded by the broken lines of the radio frequency module in FIG. 1.

A radio frequency module 1a according to a first embodiment of the present disclosure is described with reference to FIGS. 1 to 3. FIG. 1 is a cross-sectional view of the radio frequency module 1a. FIG. 2 is an enlarged view of an area surrounded by broken lines in FIG. 1. FIG. 3 is a view illustrating a structure of a mesh sheet of the area surrounded by the broken lines in FIG. 1.

As illustrated in FIGS. 1 to 3, the radio frequency module 1a according to this embodiment includes a wiring board 2, a plurality of components 3a mounted on an upper surface 2a of the wiring board 2, a sealing resin layer 4 stacked on the upper surface 2a of the wiring board 2, a mesh sheet 5 disposed on an upper surface 4a of the sealing resin layer 4 (corresponding to "an opposite surface of a sealing resin layer" according to the present disclosure), a shield film 6 that covers the upper surface 4a and side surfaces 4c of the sealing resin layer 4 and the mesh sheet 5, and a recess 7 that constitutes an identification symbol or an identification character formed in the mesh sheet 5. For example, the radio frequency module 1a is mounted on a motherboard or the like of an electronic device that uses a radio frequency signal.

The wiring board 2 includes a plurality of stacked insulating layers formed of, for example, low-temperature co-fired ceramics, high-temperature co-fired ceramics, or glass epoxy resin. Mount electrodes (not illustrated) for mounting the components 3a are formed on the upper surface 2a of the wiring board 2. A plurality of outer electrodes 8 and a plurality of solder bumps 9 for outer connection are formed on a lower surface 2b of the wiring board 2. Moreover, various types of inner wiring electrodes (not illustrated) and a ground electrode 10 are formed between adjacent layers of the insulating layers. Furthermore, a plurality of via conductors (not illustrated) are formed in the wiring board 2. The via conductors connect the inner wiring electrodes with one another. The mount electrodes, the outer electrodes 8, and the inner wiring electrodes are formed of a metal which is typically employed for wiring electrodes. Examples of the metal include copper, silver, and aluminum. Each via conductor is formed of a metal, such as silver or copper. Each mount electrode and each outer electrode 8 may be plated with nickel and gold.

Each of the components 3a is a semiconductor element, such as an integrated circuit (IC) or a power amplifier (PA); or a chip component, such as a chip inductor, a chip capacitor, or a chip resistance. The components 3a are mounted on the wiring board 2 by a typical surface mount technology, such as solder bonding.

As illustrated in FIG. 2, the sealing resin layer 4 is formed of an organic resin material 12 which is typically employed for sealing resin, such as epoxy resin including a silica filler (an inorganic filler 11), and seals each of the components 3a. The sealing resin layer 4 has a lower surface 4b (corresponding to "a contact surface of the sealing resin layer" according to the present disclosure) being in contact with the wiring board 2, the upper surface 4a (corresponding to "the opposite surface of the sealing resin layer" according to the present disclosure) opposite to the lower surface 4b, and the side surfaces 4c. To attain both the strength in a hardened state of the organic resin material 12 and the fluidity in a molten state of the organic resin material 12, the inorganic filler 11 contains particles with various particle sizes in a range from about 10 nm to 50 μm in a mixed manner.

As illustrated in FIGS. 2 and 3, the mesh sheet 5 is formed by arranging a plurality of linear members 5a at a predetermined interval in a mesh form. The mesh sheet 5 has a plurality of openings 13. Each of the linear members 5a is fiber of an inorganic oxide or a metal, and can be, for example, glass or copper. The mesh sheet 5 is formed such that a width W1 of each opening 13 is substantially equal to a width W2 of each linear member 5a. In addition, a fiber pitch P that is the sum of the width W1 of the opening 13 and the width W2 of the linear member 5a is desirably smaller than or equal to a spot diameter of a laser beam when an identification symbol or an identification character is formed in the radio frequency module 1a by laser processing. In one embodiment of the present disclosure, the spot diameter of the laser beam is the same as the diameter of the recess 7.

Laser processing for forming an identification symbol or an identification character can use, for example, an yttrium aluminum garnet (YAG) fundamental wave (wave length of 1064 nm). In this case, when the material of the linear member 5a is glass or copper, the material transmits or reflects a laser beam, and the recess 7 is not formed in the mesh sheet 5 with the laser beam. However, the organic resin material 12 exposed via the opening 13 absorbs the laser beam and burns, thereby melting the linear member 5a. Thus, the identification symbol or the identification character can be formed. When the linear member 5a is formed of a material with high absorptivity of the laser beam, the width W2 of the linear member 5a may be increased and the width W1 of the opening 13 may be decreased. In this case, the material of the linear member 5a is desirably iron or steel use stainless (SUS) with a high adhesion with the shield film 6.

The mesh sheet 5 is disposed such that a portion thereof is embedded in the upper surface 4a of the sealing resin layer 4. With such disposition, the inorganic filler 11 can be prevented from being shedded from the organic resin material 12 of the sealing resin layer 4. Moreover, since the portion of the mesh sheet 5 is embedded in the sealing resin layer 4, the mesh sheet 5 can be prevented from being separated from the sealing resin layer 4. The mesh sheet 5 is disposed only on the upper surface 4a of the sealing resin layer 4.

The shield film 6 covers surfaces (the upper surface 4a and the side surfaces 4c) of the sealing resin layer 4 and side surfaces 2c of the wiring board 2. The shield film 6 is connected to the ground electrode 10 that is exposed from the side surfaces 2c of the wiring board 2.

The shield film 6 can be formed of a multilayer structure including an adhesive film stacked on the surfaces of the sealing resin layer 4 and the side surfaces 2c of the wiring board 2, a conductive film stacked on the adhesivet film, and a rustproof film stacked on the conductive film. The adhesive film is provided to increase the strength of the adhesion between the conductive film and the sealing resin layer 4. For example, the adhesive film can be formed of a material that forms passivity, such as titanium, chromium, or SUS. Forming the adhesive film using such a material can improve an adhesion between the mesh sheet 5 and the inorganic filler 11 of the sealing resin layer 4. The conductive film is a layer that provides a substantial shield function of the shield film 6. The conductive film can be formed of, for example, a metal of copper, silver, and aluminum. The rustproof film is provided to prevent the conductive film from being corroded or damaged. The protection film can be formed of, for example, SUS. The shield film 6 is electrically connected to the ground electrode 10 that is exposed from the side surfaces 2c of the wiring board 2.

The adhesion between the shield film 6 and the mesh sheet 5 can be obtained from a phenomenon in which the constituent element of the material of the linear member 5a exposed from the upper surface 4a of the sealing resin layer 4 is bonded to the material of the shield film 6, and an anchor effect using protrusions and depressions of the mesh sheet 5 exposed from the upper surface 4a of the sealing resin layer 4. When the material of the linear member 5a is an inorganic oxide, oxygen in the inorganic oxide is bonded to a metal that is the material of the shield film 6, thereby attaining an adhesion therebetween. When the material of the linear member 5a is a metal, the metal of the linear member 5a is bonded to a metal of the material of the shield film 6 by metallic bonding, thereby attaining an adhesion therebetween.

In contrast, the adhesion between the mesh sheet 5 and the sealing resin layer 4 is obtained by physical bonding because the portion of the mesh sheet 5 is embedded in the sealing resin layer 4. The mesh sheet 5 has a predetermined thickness. Hence, the thickness of the portion of the mesh sheet 5 exposed from the sealing resin layer 4 and the thickness of the portion of the mesh sheet 5 embedded in the sealing resin layer 4 can be stably controlled. This corresponds to stably providing a state in which the inorganic filler 11 of the sealing resin layer 4 is exposed by a sufficient area from the surfaces of the sealing resin layer 4 and the inorganic filler 11 is embedded in the sealing resin layer 4 without necessarily being shedded. That is, according to the present embodiment, the adhesion between the sealing resin layer 4 and the shield film 6 can be improved without necessarily using a metal compound layer like the related art.

Method of Manufacturing Radio Frequency Module Next, a method of manufacturing the radio frequency module 1a is described. In the first embodiment, a group of a plurality of radio frequency modules 1a is formed and then is divided into individual pieces. Thus, the radio frequency module 1a is manufactured. The order of steps may be exchanged and a new step may be added if required.

First, the wiring board 2 in which the mount electrodes are formed on the upper surface 2a thereof, the outer electrodes 8 are formed on the lower surface 2b thereof, and a plurality of ground electrodes 10, a plurality of wiring electrodes, and a plurality of via conductors are formed on or in a surface layer or an inner layer is prepared. Each mount electrode, each outer electrode 8, each wiring electrode, and each ground electrode 10 can be formed by applying a conductive paste containing a metal, such as copper, silver, or aluminum by screen printing or the like. Each via conductor can be formed by performing a known method after a via hole is formed by a laser or the like. A component 3a is mounted on the upper surface 2a of the wiring board 2 by using a known surface mount technology. For example, solder is applied on desirable mount electrodes among the mount electrodes formed on the upper surface 2a of the wiring board 2, the component 3a is mounted on corresponding mount electrodes among the mount electrodes having solder applied, and then reflow processing is performed.

Next, the sealing resin layer 4 is formed to cover the component 3a mounted on the upper surface 2a of the wiring board 2. The sealing resin layer 4 can be formed by using, for example, transfer molding, compression molding, or resin dispensing. At this time, the mesh sheet 5 is disposed on the upper surface 4a of the sealing resin layer 4. The sealing resin layer 4 can use epoxy resin including a typical silica filler (the inorganic filler 11). Moreover, to cause the sealing resin layer 4 to have high thermal conductivity, epoxy resin including a filler with high thermal conductivity, such as an alumina filler can be used.

After the formation of the sealing resin layer 4, the solder bumps 9 are formed on the outer electrodes 8 formed on the lower surface 2b of the wiring board 2. Then, an identification symbol or an identification character is formed in the upper surface 4a of the sealing resin layer 4 by laser processing. Alternatively, an identification symbol or an identification character can be formed by using a technology of applying a material, for example, ejecting ink or the like. When an identification symbol or an identification character is formed by application of a material or the like, the application of the material may be performed after the formation of the shield film 6.

Then, a surface resin component remaining on the upper surface 4a of the sealing resin layer 4 or a mold resin component remaining when the sealing resin layer 4 is formed by transfer molding and demolded is removed. To remove the remaining component, a known physical or chemical removing method can be used, such as grinding, cutting, sandblasting, laser irradiation, etching, plasma cleaning, dry etching, or ion milling. In the step of removing the remaining component, the remaining component is removed and a portion of the mesh sheet 5 is exposed from the upper surface 4a of the sealing resin layer 4.

Figure 4:
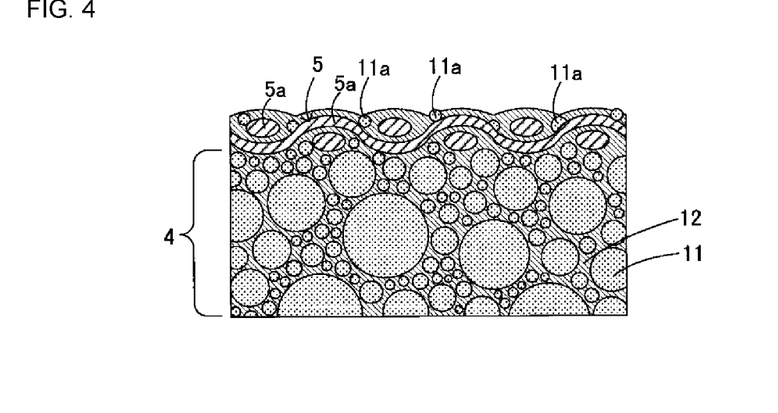
FIG. 4 is an enlarged view illustrating a manufacturing step of a portion of the radio frequency module in FIG. 1.
Figure 5:
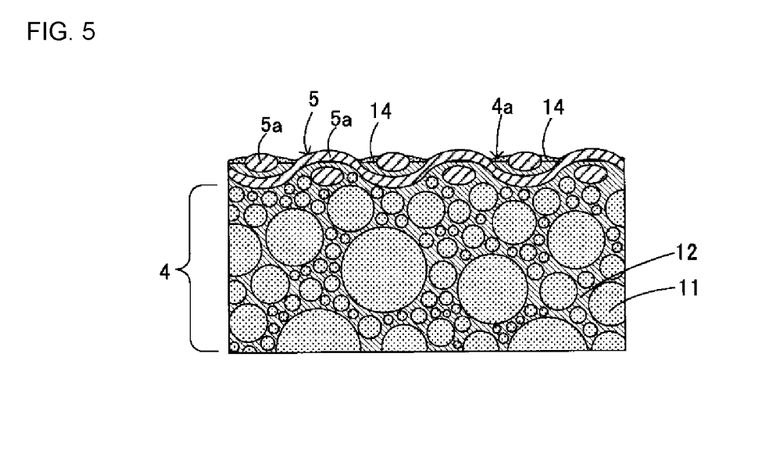
FIG. 5 is an enlarged view illustrating a manufacturing step of a portion of the radio frequency module in FIG. 1.

When the remaining component is removed by laser irradiation, as illustrated in FIG. 4, a very small inorganic filler 11a adhering to the surface of the mesh sheet 5 is molten by laser irradiation. That is, the organic resin material 12 around the inorganic filler 11a burns and generates heat by laser irradiation, and the heat melts the very small inorganic filler 11a. When the very small inorganic filler 11a is molten, as illustrated in FIG. 5, a molten inorganic filler layer 14 is formed on the upper surface 4a of the sealing resin layer 4. Since the inorganic fillers 11 and 11a are formed of an inorganic oxide, oxygen of the molten inorganic filler layer 14 is bonded to the material of the shield film 6, thereby contributing to an improvement in the adhesion between the shield film 6 and the sealing resin layer 4.

Next, a group of a plurality of radio frequency modules 1a is divided into individual pieces, thereby obtaining individual-piece modules in each of which the mesh sheet 5 is disposed on the upper surface 4a of the sealing resin layer 4. After the division into the individual pieces, the shield film 6 is formed. Thus, the radio frequency module 1a is completed. The formation of the shield film 6 can employ a known method, such as sputtering, vacuum deposition, plating, or application of conductive resin. Before the formation of the shield film 6, a step of removing the remaining component by a dry process, such as plasma cleaning, dry etching, or ion milling, may be added.

According to the above-described embodiment, by disposing the mesh sheet 5 such that a portion of the mesh sheet 5 is embedded in the upper surface 4a of the sealing resin layer 4, the mesh sheet 5 is physically bonded to the sealing resin layer 4. Furthermore, by bonding the constituent element of the material of the linear member 5a that constitutes the mesh sheet 5 to the material of the shield film 6, the adhesion between the sealing resin layer 4 and the shield film 6 can be improved. Moreover, since the mesh sheet 5 is disposed only on the upper surface 4a of the sealing resin layer 4, the ground electrode 10 exposed from the side surfaces 2c of the wiring board 2 is directly connected to the shield film 6. The resistance value between the shield film 6 and the ground electrode 10 is not increased, and shield performance can be prevented from being decreased.

Moreover, when an identification symbol or an identification character is formed in the radio frequency module 1a by laser processing, and when the linear member 5a is constituted of a material that transmits or reflects a laser beam, it is difficult to form a recess 7 in the mesh sheet 5 by laser processing, and recognizability of the identification symbol or the identification character is decreased. However, since the mesh sheet 5 has the opening 13, a laser beam reaches the organic resin material 12 via the opening 13 to burn the organic resin material 12, and the heat during burning melts the linear member 5a to form the recess 7 in the mesh sheet 5. Thus, a highly recognizable identification symbol or identification character can be formed.

Figure 6:
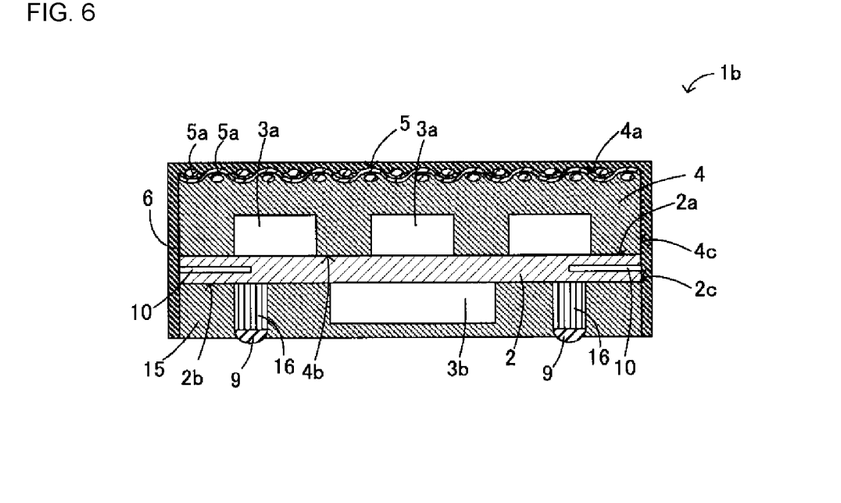
FIG. 6 is a view illustrating a modification of the radio frequency module in FIG. 1.

Modification of Radio Frequency Module A modification of the radio frequency module 1a is described with reference to FIG. 6. FIG. 6 is a cross-sectional view of a radio frequency module 1b.

As illustrated in FIG. 6, in the radio frequency module 1b, a component 3b is mounted on a lower surface 2b of the wiring board 2 and the component 3b is sealed with a second sealing resin layer 15. With this configuration, an outer connection terminal of the radio frequency module 1b is formed of a column electrode 16 and a solder bump 9 formed on the lower surface 2b of the wiring board 2. Alternatively, the second sealing resin layer 15 may not be formed and the component 3b may be exposed to the outside.

Second Embodiment

Figure 7:
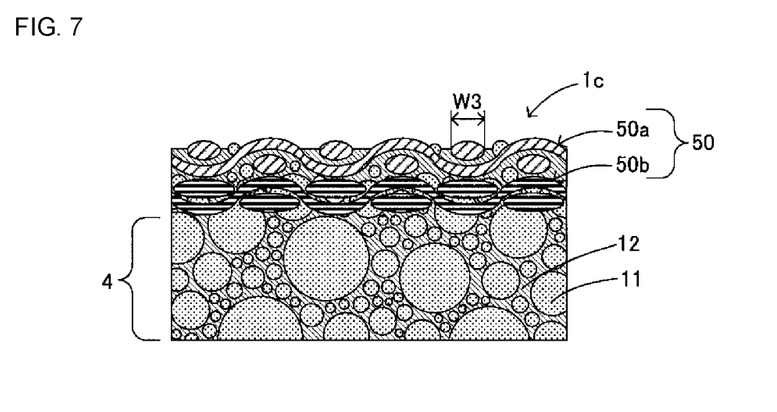
FIG. 7 is an enlarged view of a portion of a radio frequency module according to a second embodiment of the present disclosure.
Figure 8:
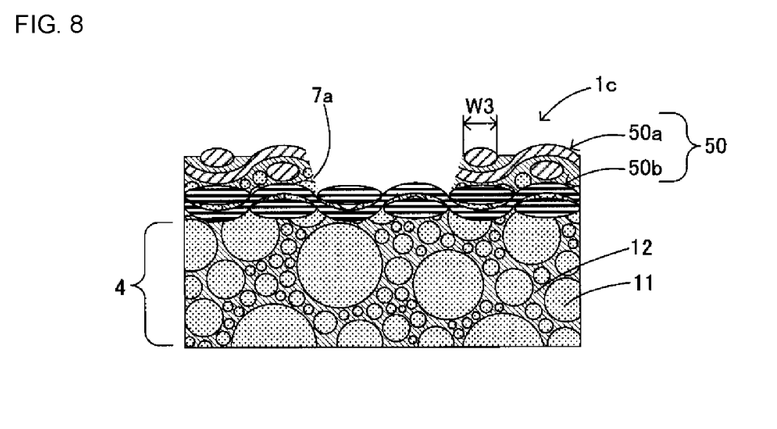
FIG. 8 is a view illustrating the radio frequency module in FIG. 7 after laser processing.

A radio frequency module 1c according to a second embodiment of the present disclosure is described with reference to FIGS. 7 and 8. FIG. 7 is an enlarged view of a portion of the radio frequency module 1c before laser processing. FIG. 8 is an enlarged view of the portion of the radio frequency module 1c after laser processing.

The radio frequency module 1c according to this embodiment differs from the radio frequency module 1a of the first embodiment described with reference to FIGS. 1 and 2 in that, as illustrated in FIGS. 7 and 8, the mesh sheet 50 includes two layers. The other configuration is similar to that of the radio frequency module 1a of the first embodiment. The same reference sign is applied to the same component and the redundant description is omitted.

In this embodiment, as illustrated in FIG. 7, a mesh sheet 50 includes two layers. The mesh sheet 50 includes two layers of a first sheet 50b (corresponding to "a first mesh sheet" according to the present disclosure) and a second sheet 50a (corresponding to "a second mesh sheet" according to the present disclosure) stacked on the first sheet 50b. The first sheet 50b is constituted of a material with high reflectivity for a laser beam that forms an identification symbol or an identification character. For example, when a YAG fundamental wave is used for laser processing, the material is desirably copper. The second sheet 50a is constituted of a material, such as glass or copper, so that the second sheet 50a does not absorb a laser beam and is bonded to the material of the shield film 6.

As illustrated in FIG. 8, when a recess 7a is formed in the upper surface 4a of the sealing resin layer 4 and the mesh sheet 50 by laser processing, the first sheet 50b reflects a laser beam to increase melting efficiency of the second sheet 50a, and avoids transmission of the laser beam to a portion below the first sheet 50b of the sealing resin layer 4, thereby preventing the component 3a mounted on the upper surface 2a of the wiring board 2 from being damaged by the laser beam. The first sheet 50b desirably has a narrower opening than the opening of the second sheet 50a or does not substantially have an opening. In this case, the second sheet 50a desirably has an opening and the organic resin material 12 of the sealing resin layer 4 is desirably exposed via the opening. However, when the first sheet 50b sufficiently has the melting effect for the second sheet 50a, a fiber width W3 of the second sheet 50a may be increased to narrow the opening thereof. In this embodiment, a plurality of first sheets 50b may be stacked.

With this configuration, in addition to an advantageous effect similar to that of the radio frequency module 1a of the first embodiment, the laser beam that forms an identification symbol or an identification character does not reach the component 3a mounted on the upper surface 2a of the wiring board 2, thereby preventing the component 3a from being damaged.

Third Embodiment

Figure 9:
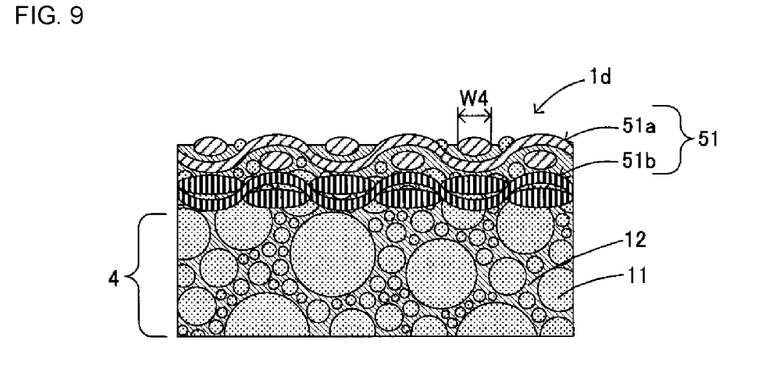
FIG. 9 is an enlarged view of a portion of a radio frequency module according to a third embodiment of the present disclosure.
Figure 10:
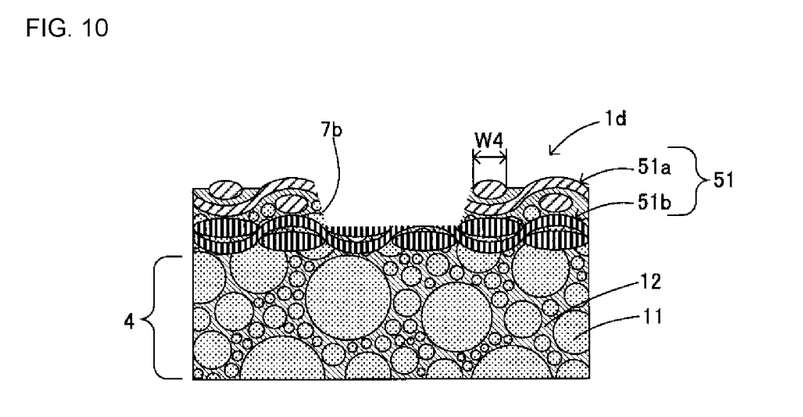
FIG. 10 is a view illustrating the radio frequency module in FIG. 9 after laser processing.

A radio frequency module 1d according to a third embodiment of the present disclosure is described with reference to FIGS. 9 and 10. FIG. 9 is an enlarged view of a portion of the radio frequency module 1d before laser processing. FIG. 10 is an enlarged view of the portion of the radio frequency module 1d after laser processing.

The radio frequency module 1d according to this embodiment differs from the radio frequency module 1c according to the second embodiment described with reference to FIGS. 7 and 8 in that, as illustrated in FIGS. 9 and 10, a first sheet 51b is formed of a material with high absorptivity for a laser beam. The other configuration is similar to that of the radio frequency module 1c of the second embodiment. The same reference sign is applied to the same component and the redundant description is omitted.

In this embodiment, as illustrated in FIG. 9, a mesh sheet 51 includes two layers of a first sheet 51b and a second sheet 51a stacked on the first sheet 51b. The first sheet 51b is constituted of a material with high absorptivity for a laser beam that forms an identification symbol or an identification character. For example, when a YAG fundamental wave is used for laser processing, the material is desirably carbon, iron, or SUS. The second sheet 51a is constituted of a material, such as glass or copper, so that the second sheet 51a does not absorb a laser beam and is bonded to the material of the shield film 6.

As illustrated in FIG. 10, when a recess 7b is formed in the upper surface 4a of the sealing resin layer 4 and the mesh sheet 51 by laser processing, the first sheet 51b absorbs a laser beam to increase melting efficiency of the second sheet 51a and the first sheet 51b remains without necessarily being completely molten, and avoids transmission of the laser beam to a portion below the first sheet 51b of the sealing resin layer 4, thereby preventing the component 3a mounted on the upper surface 2a of the wiring board 2 from being damaged by the laser beam. The first sheet 51b desirably has a narrower opening than the opening of the second sheet 51a or does not substantially have an opening. In this case, the second sheet 51a desirably has an opening and the organic resin material 12 of the sealing resin layer 4 is desirably exposed via the opening. However, when the first sheet 51b sufficiently has the melting effect for the second sheet 51a, a fiber width W4 of the second sheet 51a may be increased to narrow the opening thereof. In this embodiment, a plurality of first sheets 51b may be stacked.

With this configuration, in addition to an advantageous effect similar to that of the radio frequency module 1a of the first embodiment, the laser beam that forms an identification symbol or an identification character does not reach the component 3a mounted on the upper surface 2a of the wiring board 2, thereby preventing the component 3a from being damaged.

Fourth Embodiment

Figure 11:
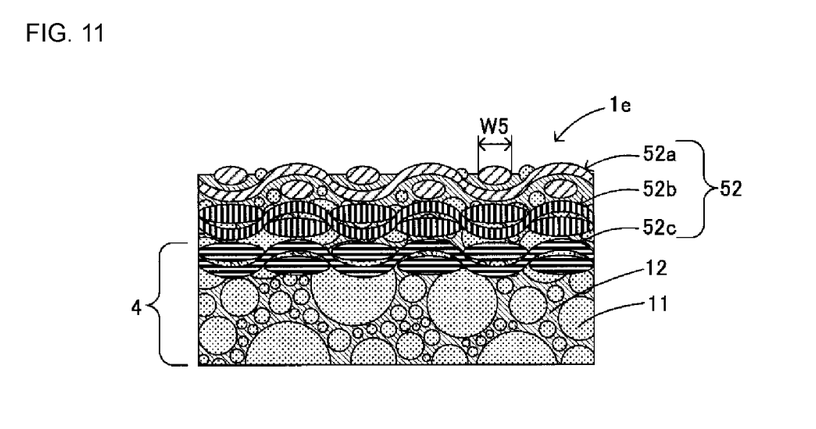
FIG. 11 is an enlarged view of a portion of a radio frequency module according to a fourth embodiment of the present disclosure.
Figure 12:
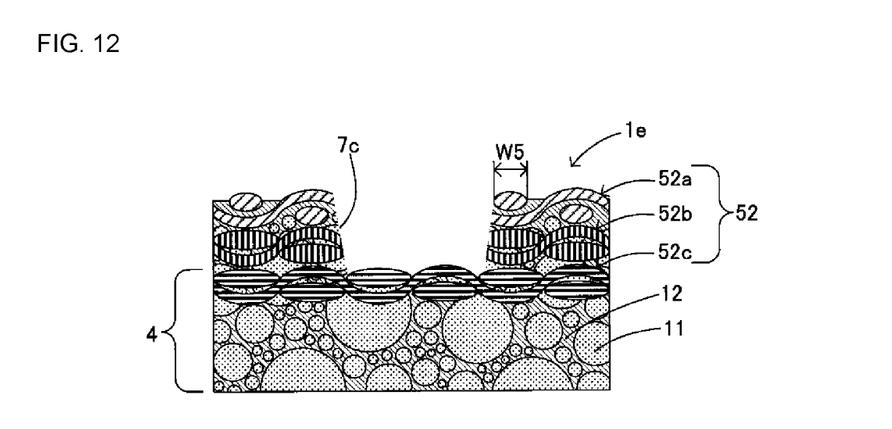
FIG. 12 is a view illustrating the radio frequency module in FIG. 11 after laser processing.

A radio frequency module 1e according to a fourth embodiment of the present disclosure is described with reference to FIGS. 11 and 12. FIG. 11 is an enlarged view of a portion of the radio frequency module 1e before laser processing. FIG. 12 is an enlarged view of the portion of the radio frequency module 1e after laser processing.

The radio frequency module 1e according to this embodiment differs from the radio frequency module 1c according to the second embodiment described with reference to FIGS. 7 and 8 in that, as illustrated in FIGS. 11 and 12, a mesh sheet 52 includes three layers. The other configuration is similar to that of the radio frequency module 1c of the second embodiment. The same reference sign is applied to the same component and the redundant description is omitted.

In this embodiment, as illustrated in FIG. 11, the mesh sheet 52 includes three layers of a first sheet 52c, a second sheet 52b stacked on the first sheet 52c, and a third sheet 52a stacked on the second sheet 52b. The first sheet 52c is constituted of a material with high reflectivity for a laser beam that forms an identification symbol or an identification character. For example, when a YAG fundamental wave is used for laser processing, the material is desirably copper. The second sheet 52b is constituted of a material with high absorptivity for a laser beam. For example, when a YAG fundamental wave is used for laser processing, the material is desirably carbon, iron, or SUS. The third sheet 52a is constituted of a material, such as glass or copper, so that the third sheet 52a does not absorb a laser beam and is bonded to the material of the shield film 6.

As illustrated in FIG. 12, when a recess 7c is formed in the upper surface 4a of the sealing resin layer 4 and the mesh sheet 52 by laser processing, the first sheet 52c reflects a laser beam to increase melting efficiency of the second sheet 52b and the third sheet 52a, and avoids transmission of the laser beam to a portion below the first sheet 52c of the sealing resin layer 4, thereby preventing the component 3a mounted on the upper surface 2a of the wiring board 2 from being damaged by the laser beam. The second sheet 52b absorbs the laser beam to increase the melting efficiency of the third sheet 52a. The first sheet 52c and the second sheet 52b desirably have narrower openings than the opening of the third sheet 52a or do not substantially have an opening. In this case, the third sheet 52a desirably has an opening and the organic resin material 12 of the sealing resin layer 4 is desirably exposed via the opening. However, when the first sheet 52c and the second sheet 52b sufficiently have the melting effect for the third sheet 52a, a fiber width W5 of the third sheet 52a may be increased to narrow the opening thereof.

With this configuration, in addition to an advantageous effect similar to that of the radio frequency module 1a of the first embodiment, a laser beam that forms an identification symbol or an identification character does not reach the component 3a mounted on the upper surface 2a of the wiring board 2, thereby preventing the component 3a from being damaged.

The present disclosure is not limited to the embodiments described above, and various modifications can be made in addition to the modifications described above within the scope of the disclosure. For example, the configurations of the above-described embodiments and modifications may be combined.

INDUSTRIAL APPLICABILITY

The present disclosure can be applied to various radio frequency modules each including a shield.

REFERENCE SIGNS LIST 1a to 1e radio frequency module
2 wiring board
3a, 3b component
4 sealing resin layer
5, 50 to 52 mesh sheet
5a linear member
6 shield film
13 opening

The invention claimed is:

1. A radio frequency module comprising:
a wiring board;
a component on one principal surface of the wiring board;
a sealing resin layer that has a contact surface being in contact with the one principal surface of the wiring board, an opposite surface opposite to the contact surface, and side surfaces connecting end edges of the contact surface with end edges of the opposite surface, and that seals the component;
a mesh sheet on the opposite surface of the sealing resin layer, the mesh sheet comprising a plurality of linear members intersecting with one another in a mesh form; and
a shield film that covers at least the side surfaces of the sealing resin layer and the mesh sheet on the opposite surface of the sealing resin layer,
wherein an embedded portion of the mesh sheet is embedded in the sealing resin layer in a thickness direction of the mesh sheet,
wherein an exposed portion of the plurality of linear members of the mesh sheet is exposed from the opposite surface of the sealing resin layer, and
wherein the exposed portion contacts the shield film.

2. The radio frequency module according to claim 1,
wherein the mesh sheet comprises a recess created by laser processing in a shape of an identification symbol or an identification character,
wherein the mesh sheet has a plurality of openings between the plurality of linear members arranged at a predetermined interval, and
wherein the predetermined interval is smaller than or equal to a spot diameter of a laser beam that is used for the laser processing.

3. The radio frequency module according to claim 1,
wherein the mesh sheet comprises a recess created by laser processing in a shape of an identification symbol or an identification character,
wherein the mesh sheet includes a first mesh sheet being in contact with the opposite surface of the sealing resin layer and a second mesh sheet stacked on the first mesh sheet,
wherein the first mesh sheet comprises the plurality of linear members that comprise a material that reflects a laser beam, and
wherein the second mesh sheet comprises the plurality of linear members that comprise a material that transmits a laser beam.

4. The radio frequency module according to claim 1,
wherein the mesh sheet comprises a recess created by laser processing in a shape of an identification symbol or an identification character,
wherein the mesh sheet includes a first mesh sheet being in contact with the opposite surface of the sealing resin layer and a second mesh sheet stacked on the first mesh sheet,
wherein the first mesh sheet and the second mesh sheet comprise the plurality of linear members that comprise a material that reflects a laser beam, and
wherein the second mesh sheet has a plurality of openings between the plurality of linear members arranged at a predetermined interval, and a line width of each of the plurality of linear members in the second mesh sheet is smaller than a line width of each of the plurality of linear members in the first mesh sheet.

5. The radio frequency module according to claim 1,
wherein the mesh sheet comprises a recess created by laser processing in a shape of an identification symbol or an identification character,
wherein the mesh sheet includes a first mesh sheet being in contact with the opposite surface of the sealing resin layer and a second mesh sheet stacked on the first mesh sheet, and
wherein the first mesh sheet comprises the plurality of linear members that comprise a material that absorbs a laser beam.

6. The radio frequency module according to claim 1, further comprising:
another component on another principal surface of the wiring board; and
an outer connection terminal on the other principal surface of the wiring board.

7. The radio frequency module according to claim 2, further comprising:
another component on another principal surface of the wiring board; and
an outer connection terminal on the other principal surface of the wiring board.

8. The radio frequency module according to claim 3, further comprising:
another component on another principal surface of the wiring board; and
an outer connection terminal on the other principal surface of the wiring board.

9. The radio frequency module according to claim 4, further comprising:
another component on another principal surface of the wiring board; and
an outer connection terminal on the other principal surface of the wiring board.

10. The radio frequency module according to claim 5, further comprising:
another component on another principal surface of the wiring board; and an outer connection terminal on the other principal surface of the wiring board.

\* \* \* \* \*

UNITED STATES PATENT AND TRADEMARK OFFICE
CERTIFICATE OF CORRECTION

| | |
|---|---|
| PATENT NO. | : 11,903,120 B2 |
| APPLICATION NO. | : 16/990109 |
| DATED | : February 13, 2024 |
| INVENTOR(S) | : Tadashi Nomura |

It is certified that error appears in the above-identified patent and that said Letters Patent is hereby corrected as shown below:

In the Specification

Column 1, Line 45, "paragraphs 00015" should be -- paragraphs 0015 --.

Signed and Sealed this
Twenty-ninth Day of October, 2024

Katherine Kelly Vidal
*Director of the United States Patent and Trademark Office*